(12) United States Patent
Koo et al.

(10) Patent No.: US 10,290,658 B2
(45) Date of Patent: May 14, 2019

(54) THIN FILM TRANSISTOR SUBSTRATE AND DISPLAY DEVICE INCLUDING THE SAME

(71) Applicant: LG Display Co., Ltd., Seoul (KR)

(72) Inventors: HyungJoon Koo, Seoul (KR); SeHee Park, Seoul (KR); Kwanghwan Ji, Taebaek-si (KR); PilSang Yun, Goyang-si (KR); Jaeyoon Park, Paju-si (KR); HongRak Choi, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/828,207

(22) Filed: Nov. 30, 2017

(65) Prior Publication Data

US 2018/0175077 A1  Jun. 21, 2018

(30) Foreign Application Priority Data

Dec. 16, 2016  (KR) .......................... 10-2016-0172913

(51) Int. Cl.
*H01L 27/12* (2006.01)
*H01L 27/32* (2006.01)
*H01L 29/786* (2006.01)

(52) U.S. Cl.
CPC ........ *H01L 27/1255* (2013.01); *H01L 27/124* (2013.01); *H01L 27/1251* (2013.01); *H01L 27/3272* (2013.01); H01L 27/1225 (2013.01); H01L 27/3262 (2013.01); H01L 27/3265 (2013.01); H01L 29/7869 (2013.01); H01L 29/78633 (2013.01); H01L 29/78648 (2013.01)

(58) Field of Classification Search
CPC .................................................. H01L 27/3262
See application file for complete search history.

(56) References Cited

U.S. PATENT DOCUMENTS

| | | | |
|---|---|---|---|
| 6,335,778 B1 * | 1/2002 | Kubota ............... | G09G 3/3648 345/98 |
| 2001/0019384 A1 * | 9/2001 | Murade ............. | G02F 1/133512 349/110 |
| 2008/0106207 A1 * | 5/2008 | Yoon .................... | G09G 3/3233 315/158 |
| 2015/0187959 A1 * | 7/2015 | Yoon .................... | H01L 27/1225 257/43 |
| 2018/0122882 A1 * | 5/2018 | Lee ..................... | H01L 27/1248 |

OTHER PUBLICATIONS

Kawamura, T., et al. "1.5-V Operating Fully-Depleted Amorphous Oxide Thin Film Transistors Achieved by 63-mV/dec Subthreshold Slope," *Hitachi, Ltd., Central Research Laboratory* 1-280, Higashi-koigakubo, Kokubunji-shi, Tokyo 185-8601, Japan.

* cited by examiner

*Primary Examiner* — Thao P Le
(74) *Attorney, Agent, or Firm* — Seed IP Law Group LLP

(57) ABSTRACT

Disclosed is a thin film transistor substrate which facilitates to realize a bottom gate structure where a gate electrode is disposed below an active layer, and to increase an area for a storage capacitor, and a display device including the same, wherein the thin film transistor substrate may include a light shielding layer, a buffer layer for covering the light shielding layer, and a driving transistor prepared on the buffer layer while being overlapped with the light shielding layer, and provided to supply a driving current to an organic light emitting device.

20 Claims, 9 Drawing Sheets

FIG. 10
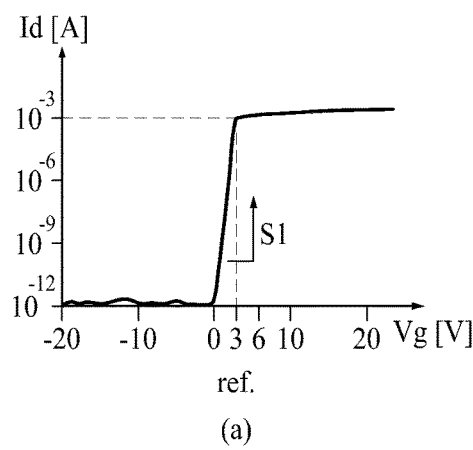
(a) ref.
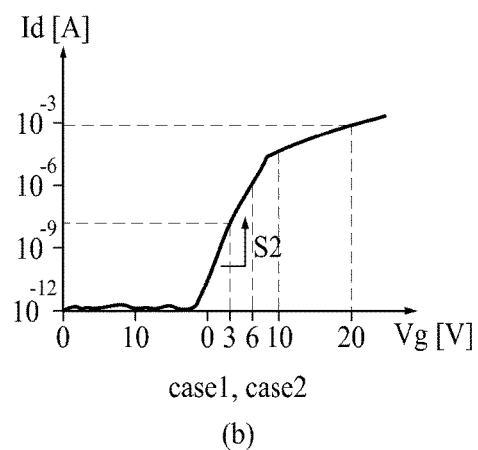
(b) case1, case2

THIN FILM TRANSISTOR SUBSTRATE AND DISPLAY DEVICE INCLUDING THE SAME

CROSS REFERENCE TO RELATED APPLICATIONS

This application claims the benefit of the Korean Patent Application No. 10-2016-0172913 filed on Dec. 16, 2016, which is hereby incorporated by reference as if fully set forth herein.

BACKGROUND

Technical Field

Embodiments of the present disclosure relate to a thin film transistor substrate and a display device including the same.

Description of the Related Art

With the advancement of multimedia, the importance of display devices has increased. Thus, various flat display devices of a liquid crystal display device, a plasma display device, and an organic light emitting display device have been utilized. Among the flat display devices, the liquid crystal display device and the organic light emitting display device are widely used for display devices of a notebook computer, a television, a tablet computer, a monitor, a smart phone, and a mobile display apparatus.

A display panel used for the liquid crystal display device and the organic light emitting display device includes a thin film transistor (TFT) and a storage capacitor (Cst). In case of the thin film transistor (TFT), it is very important to maintain the electrical reliability and durability for a long lifespan as well as the elemental properties such as mobility and leakage current.

The thin film transistor (TFT) includes an active layer for a channel area, a source area, and a drain area. The active layer of the thin film transistor (TFT) is formed of a semiconductor material such as amorphous silicon or polysilicon. If the active layer is formed of the amorphous silicon, its mobility is low so that it is difficult to realize a driving circuit which is driven at high speed. If the active layer is formed of the polysilicon, its mobility is high. However, a threshold voltage is not uniform, so it becomes necessary to provide an additional compensation circuit. In order to overcome this problem, an oxide thin film transistor having an active layer of an oxide semiconductor has been researched actively.

If a related art driving transistor is formed of the thin film transistor (TFT), it is designed in a top gate structure where a gate electrode is disposed above the active layer. In case of the driving transistor with the top gate structure, it has a large inclination in a S-factor graph. The S-factor graph shows a ratio of a change of a gate voltage to a change of a driving current in the driving transistor. If the inclination of the S-factor graph of the driving transistor is large, a usable range of a data voltage becomes small, whereby it is disadvantageous in low grayscale expression. Also, if the driving transistor has a small S-factor, it may cause a large error of the driving current.

In case of the related art driving transistor, a source node is realized in a source/drain metal thin film. In this case, the number of contact holes (CNT) is large, resulting in a complicated structure. Also, it is difficult to have a large area of the storage capacitor due to the contact holes prepared in the source/drain metal thin film adjacent to the source node.

BRIEF SUMMARY

Accordingly, embodiments of the present disclosure are directed to a thin film transistor substrate that substantially obviates one or more problems due to limitations and disadvantages of the related art, and a display device including the same.

An aspect of embodiments of the present disclosure is directed to provide a thin film transistor substrate which facilitates a bottom gate structure where a gate electrode is disposed below an active layer. It provides an increased area for a storage capacitor, and a display device including the same.

Additional advantages and features of embodiments of the disclosure will be set forth in the description which follows and will also become apparent to those having ordinary skill in the art upon examination of the following or may be learned from practice of embodiments of the disclosure. The objectives and other advantages of embodiments of the disclosure may be realized and attained by the structure particularly pointed out in the written description and claims hereof as well as the appended drawings To achieve these and other advantages and in accordance with the purpose of embodiments of the disclosure, as embodied and broadly described herein, there is provided a film transistor substrate that may include a light shielding layer, a buffer layer for covering the light shielding layer, and a driving transistor prepared on the buffer layer while being overlapped with the light shielding layer, and provided to supply a driving current to an organic light emitting device. At this time, the driving transistor receives a first voltage through the light shielding layer.

In another aspect of an embodiment of the present disclosure, there is provided a display device that may include a thin film transistor substrate, and an opposite substrate bonded to the thin film transistor substrate.

It is to be understood that both the foregoing general description and the following detailed description of embodiments of the present disclosure are exemplary and explanatory and are intended to provide further explanation of the disclosure as claimed.

BRIEF DESCRIPTION OF THE DRAWINGS

The accompanying drawings, which are included to provide a further understanding of embodiments of the disclosure and are incorporated in and constitute a part of this application, illustrate embodiment(s) of the disclosure and together with the description serve to explain the principle of embodiments of the disclosure. In the drawings:

FIG. 10 illustrates a S-factor graph of the related art thin film transistor substrate and a S-factor graph of the thin film transistor substrate according to one embodiment of the present disclosure.

DETAILED DESCRIPTION

Figure 1:
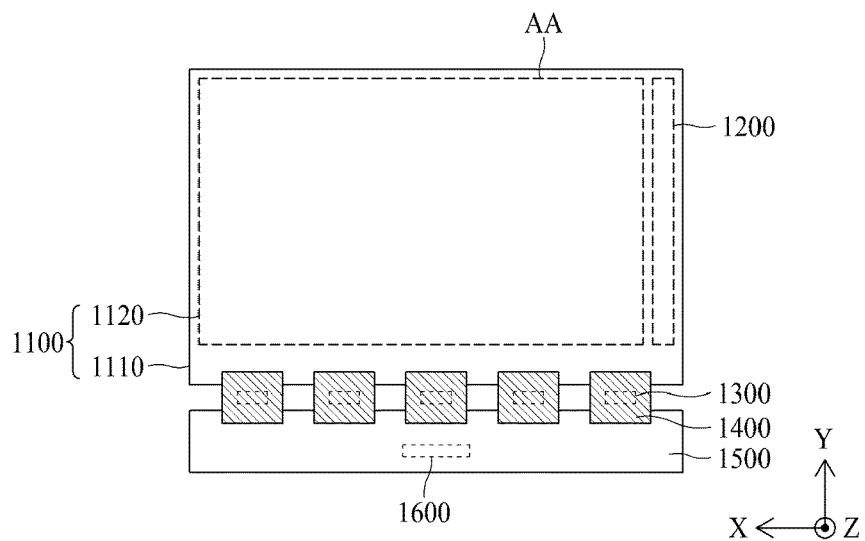
FIG. 1 is a plan view illustrating a display device according to one embodiment of the present disclosure.

Reference will now be made in detail to the example embodiments of the present disclosure, examples of which are illustrated in the accompanying drawings. Wherever possible, the same reference numbers will be used throughout the drawings to refer to the same or like parts. Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present invention is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of a known function or configuration is determined to unnecessarily obscure the important point of the present disclosure, the detailed description of such known items will be omitted.

In a case where "comprise", "have", and "include" described in the present specification are used, another part may be added unless "only~" is used. The terms of a singular form may include plural forms unless referred to the contrary.

In construing an element, the element is construed as including an error region although there is no explicit description.

In describing a position relationship, for example, when the positional order is described as "on~", "above~", "below~", "overlapped", "overlying" and "next~", a case which is not contact may be included unless "just" or "direct" is used.

In describing a time relationship, for example, when the temporal order is described as "after~", "subsequent~", "next~", and "before~", a case which is not continuous may be included unless "just" or "direct" is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Also, "X-axis direction", "Y-axis direction", and "Z-axis direction" are not limited to a perpendicular geometric configuration. That is, "X-axis direction", "Y-axis direction", and "Z-axis direction may include an applicable wide range of a functional configuration.

Also, it should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on or above" a second element, it should be understood that the first and second elements may be brought into contact with each other, or a third element may be interposed between the first and second elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, a thin film transistor substrate according to the embodiment of the present disclosure, and a display device including the same will be described in detail with reference to the accompanying drawings.

FIG. 1 is a plan view illustrating a display device according to one embodiment of the present disclosure. In FIG. 1, for convenience of explanation, a first horizontal axis direction (X) indicates a direction parallel to a gate line, a second horizontal axis direction (Y) indicates a direction parallel to a data line, and a vertical axis direction (Z) indicates a thickness direction (or height direction) of a display device. The display device according to one embodiment of the present disclosure may include a display panel 1100, a gate driver 1200, a plurality of source drive integrated circuits (source ICs) 1300, a plurality of flexible circuit films 1400, a circuit board 1500, and a timing controller 1600.

The display panel 1100 according to the present disclosure includes a thin film transistor substrate 1110, and an opposite substrate 1120.

The thin film transistor substrate 1110 includes a plurality of gate and data lines which are perpendicular to each other.

Each of the plurality of gate lines extends in the first horizontal axis direction (X) of the thin film transistor substrate 1110, and the plurality of gate lines are provided at fixed intervals along the second horizontal axis direction (Y) which is perpendicular to the first horizontal axis direction (X).

The plurality of data lines are perpendicular to the plurality of gate lines. Each of the plurality of data lines extends in the second horizontal axis direction (Y), and the plurality of data lines are provided at fixed intervals along the first horizontal axis direction (X).

Also, pixels are respectively disposed adjacent to intersections of the gate and data lines. Each pixel is connected with the gate and data lines. Each pixel includes a thin film transistor and a storage capacitor. The thin film transistor is turned-on by a gate signal of the gate line, and the turned-on thin film transistor supplies a data voltage of the data line to the pixel.

The thin film transistor substrate 1110 includes a display area (AA) and a non-display area. In the display area (AA), there are the gate and data lines crossing each other. The intersection areas obtained by the gate and data lines define pixel areas.

The non-display area is disposed in the periphery of the display area (AA). In more detail, the non-display area indicates the remaining area of the thin film transistor substrate 1110 except the display area (AA). For example, the non-display area may be left, right, lower, and upper peripheral areas of the thin film transistor substrate 1110.

The opposite substrate 1120, which is adjacent to the thin film transistor substrate 1110, is bonded to the thin film transistor substrate 1110, whereby the opposite substrate 1120 serves as an encapsulation substrate for preventing a permeation of external moisture or foreign matters.

The gate driver 1200 generates the gate signal in accordance with a gate control signal which is supplied from the timing controller 1600, and supplies the generated gate signal to the gate line. In FIG. 1, the gate driver 1200 according to one embodiment of the present disclosure is formed of a gate in panel (GIP) circuit in the non-display area of the thin film transistor substrate 1110.

The GIP circuit together with the thin film transistor of the pixel may be provided inside the non-display area of the thin film transistor substrate 1110. For example, the gate driver 1200 of the GIP circuit may be prepared in the non-display area at one side and/or the other side of the display area (AA), but not limited to this structure. The gate driver 1200 of the GIP circuit may be prepared in any portion of the non-display area enabling the supply of the gate signal to the gate line.

Each of the plurality of source drive ICs 1300 may be mounted on the flexible circuit film 1400. Each of the plurality of source drive ICs 1300 receives digital video data and data control signal from the timing controller 1600, converts the digital video data into an analog data voltage in accordance with the data control signal, and supplies the analog data voltage to the data lines. If the source drive IC 1300 is formed of a driving chip, each of the plurality of source drive ICs 1300 may be mounted on the flexible circuit film 1400 by chip on film (COF) or chip on plastic (COP) method.

Each of the plurality of flexible circuit films 1400 is attached to a pad portion prepared in the thin film transistor substrate 1110. In this case, each of the plurality of flexible circuit films 1400 is attached onto the pad portion by the use of anisotropic conducting film (ACF). Each of the flexible circuit films 1400 supplies the data voltage from the source drive IC 1300 to the data line through the pad portion. Also, at least one among the plurality of flexible circuit films 1400 supplies the gate control signal from the timing controller 1600 to the gate driver 1200.

The circuit board 1500 is connected with the plurality of flexible circuit films 1400. The circuit board 1500 supports the plurality of circuits formed of driving chips. For example, the timing controller 1600 may be mounted on the circuit board 1500. The circuit board 1500 may be a printed circuit board or a flexible printed circuit board.

The timing controller 1600 is mounted on the circuit board 1500. The timing controller 1600 receives digital video data and timing synchronization signals from an external system board. In this case, the timing synchronization signals may include a vertical synchronization signal (vertical sync signal) for defining one frame period, a horizontal synchronization signal (horizontal sync signal) for defining one horizontal period, a data enable signal for indicating whether data is valid, and a dot clock corresponding to a clock signal with a predetermined cycle.

The timing controller 1600 generates the gate control signal for controlling an operation timing of the gate driver 1200, and the data control signal for controlling the source drive ICs 1300 on the basis of timing synchronization signals. The timing controller 1600 supplies the gate control signal to the gate driver 1200, and supplies the data control signal to the plurality of source drive ICs 1300.

Figure 2:
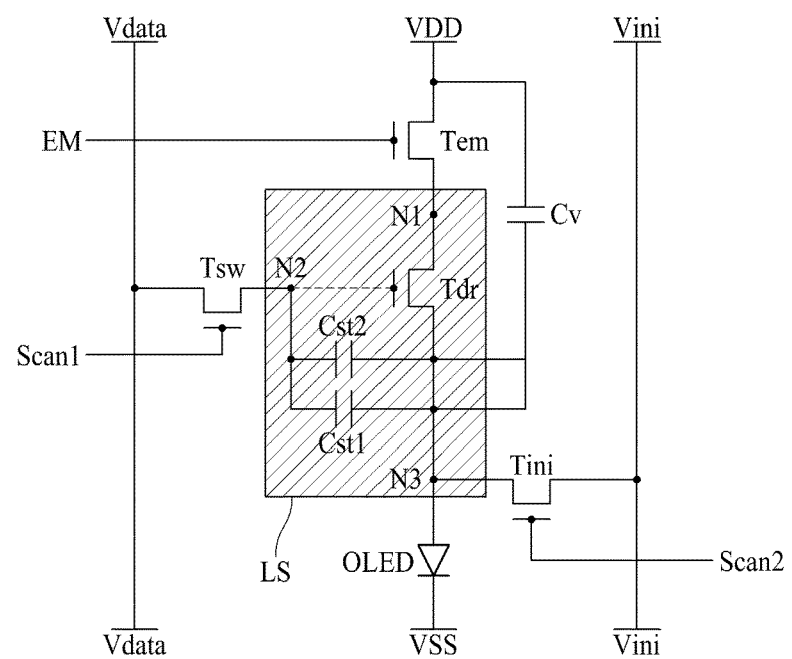
FIG. 2 is a circuit diagram illustrating a thin film transistor substrate according to one embodiment of the present disclosure.

FIG. 2 is a circuit diagram illustrating a thin film transistor substrate according to one embodiment of the present disclosure. The thin film transistor substrate according to one embodiment of the present disclosure may include an organic light emitting diode (OLED), a switching transistor (Tsw), a driving transistor (Tdr), a light emitting control transistor (Tem), an initialization transistor (Tini), a first storage capacitor (Cst1), a second storage capacitor (Cst2), a potential capacitor (Cv), and a light shielding layer (LS).

An anode electrode of the organic light emitting diode (OLED) is connected with the driving transistor (Tdr) and a source node of the initialization transistor (Tini), and a cathode electrode of the organic light emitting diode (OLED) is connected with a low-potential voltage line (VSS) supplied with a low-potential voltage which is lower than a high-potential voltage. The organic light emitting diode (OLED) emits light in accordance with a driving current supplied through the driving transistor (Tdr). An initialization voltage (Vini) is supplied to the organic light emitting diode (OLED) through the initialization transistor (Tini).

The organic light emitting diode (OLED) may include the anode electrode, a hole transporting layer, an organic light emitting layer, an electron transporting layer, and a cathode electrode. When a voltage is applied to the anode electrode and the cathode electrode of the organic light emitting diode (OLED), hole and electron are transferred to the organic light emitting layer through the hole transporting layer and the electron transporting layer, whereby the organic light emitting diode (OLED) emits light by a bond of the hole and electron in the organic light emitting layer.

A gate node of the switching transistor (Tsw) is supplied with a first scan signal (Scan1). A drain node of the switching transistor (Tsw) is connected with a data voltage line (Vdata). A source node of the switching transistor (Tsw) is connected with a second node (N2). The second node (N2) corresponds to a node where the source node of the switching transistor (Tsw) is connected with a gate node of the driving transistor (Tdr), and the first and second storage capacitors (Cst1, Cst2). The switching transistor (Tsw) is turned-on by the first scan signal (Scan1), and the turned-on switching transistor (Tsw) supplies a first voltage to the second node (N2). If the switching transistor (Tsw) is turned-on, the first voltage is the same as the currently-supplied data voltage (Vdata). Meanwhile, if the switching transistor (Tsw) is turned-off, the first voltage is the data voltage (Vdata) previously stored in the first and second storage capacitors (Cst1, Cst2). On the basis of the first scan signal (Scan1), the switching transistor (Tsw) supplies the first voltage to the gate node of the driving transistor (Tdr), and turns on the driving transistor (Tdr).

The light shielding layer (LS) which serves as the gate node of the driving transistor (Tdr) is connected with the second node (N2) in one embodiment. A drain node of the driving transistor (Tdr) is connected with a first node (N1).

The first node (N1) corresponds to a node where the drain node of the driving transistor (Tdr) is connected with a source node of the light emitting control transistor (Tem). A source node of the driving transistor (Tdr) is connected with the anode electrode of the organic light emitting diode (OLED). The driving transistor (Tdr) is turned-on by the first voltage supplied from the source node of the switching transistor (Tsw), and the turned-on driving transistor (Tdr) supplies the driving current to the organic light emitting diode (OLED) by the use of high-potential voltage (VDD) supplied from a driving power source.

A gate node of the light emitting control transistor (Tem) is supplied with a light emitting control signal (EM). A drain node of the light emitting control transistor (Tem) is supplied with the high-potential voltage (VDD). A source node of the light emitting control transistor (Tem) is connected with the second node (N2). The light emitting control transistor (Tem) is turned-on by the light emitting control signal (EM), and the turned-on light emitting control transistor (Tem) provides the high-potential voltage (VDD) in the first node (N1).

A gate node of the initialization transistor (Tini) is supplied with the second scan signal (Scan2). A drain node of the initialization transistor (Tini) is connected with an initialization voltage (Vini) line. The source node of the initialization transistor (Tini) is connected with the anode electrode of the organic light emitting diode (OLED). The initialization transistor (Tini) is turned-on by the second scan signal (Scan2), and the turned-on initialization transistor (Tini) supplies a second voltage to a third node (N3), which is also the anode electrode of the organic light emitting diode (OLED). If the initialization transistor (Tini) is turned-on, the second voltage at N3 corresponds to the current initialization voltage (Vini). If the initialization transistor (Tini) is turned-off, the second voltage at N3 corresponds to the differential voltage between the first voltage and the voltage stored in the first and second storage capacitors (Cst1, Cst2).

The first storage capacitor (Cst1) is connected between the second node (N2) and the source node of the driving transistor (Tdr). The first storage capacitor (Cst1) stores the first voltage supplied from the switching transistor (Tsw).

The second storage capacitor (Cst2) is connected between the second node (N2) and the source node of the driving transistor (Tdr). The second storage capacitor (Cst2) is connected with the first storage capacitor (Cst1) in parallel, whereby the first voltage supplied from the switching transistor (Tsw) is stored in the second storage capacitor (Cst2). If the first storage capacitor (Cst1) and the second storage capacitor (Cst2) are connected with each other in parallel, it is possible to increase the capacity of the storage capacitor.

The potential capacitor (Cv) is connected between the high-potential voltage line for supplying the high-potential voltage (VDD) and the source node of the driving transistor (Tdr). The high-potential voltage (VDD) is stored in the potential capacitor (Cv).

The light shielding layer (LS) is continuously disposed below the driving transistor (Tdr), the first and second storage capacitors (Cst1, Cst2), the first node (N1), and the second node (N2). The light shielding layer (LS) is electrically connected with the source node of the switching transistor (Tsw) in the second node (N2) in a first embodiment. In case of the driving transistor (Tdr) according to one embodiment of the present disclosure, the gate node of the driving transistor (Tdr) is not connected with the second node (N2); however, in this embodiment, the light shielding layer (LS) serves as the gate node of the driving transistor (Tdr). The light shielding layer (LS) is formed of a metal material with good electrical conduction.

Figure 3:
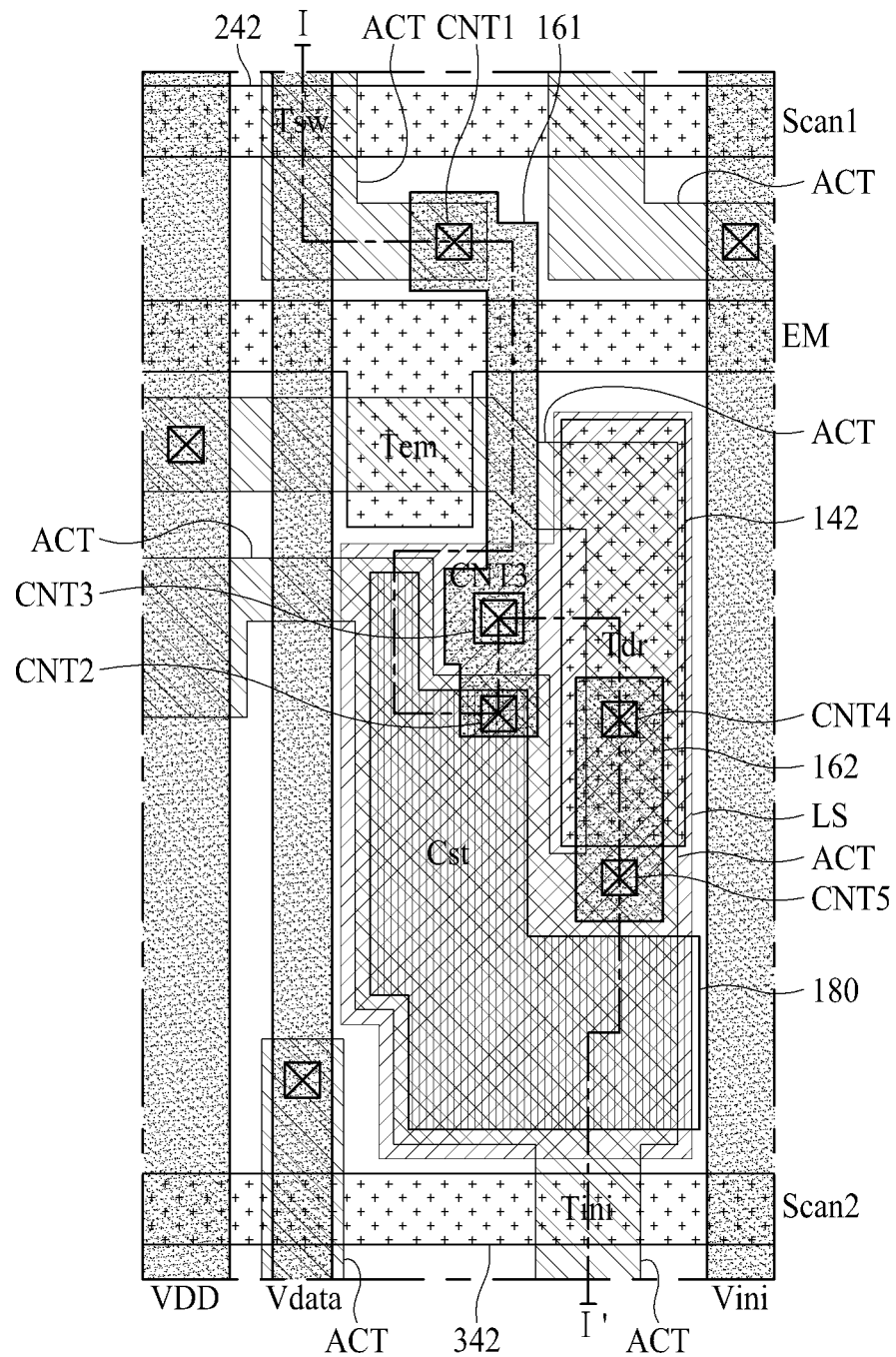
FIG. 3 is a plan view illustrating a thin film transistor substrate according to one embodiment of the present disclosure.
Figure 4:
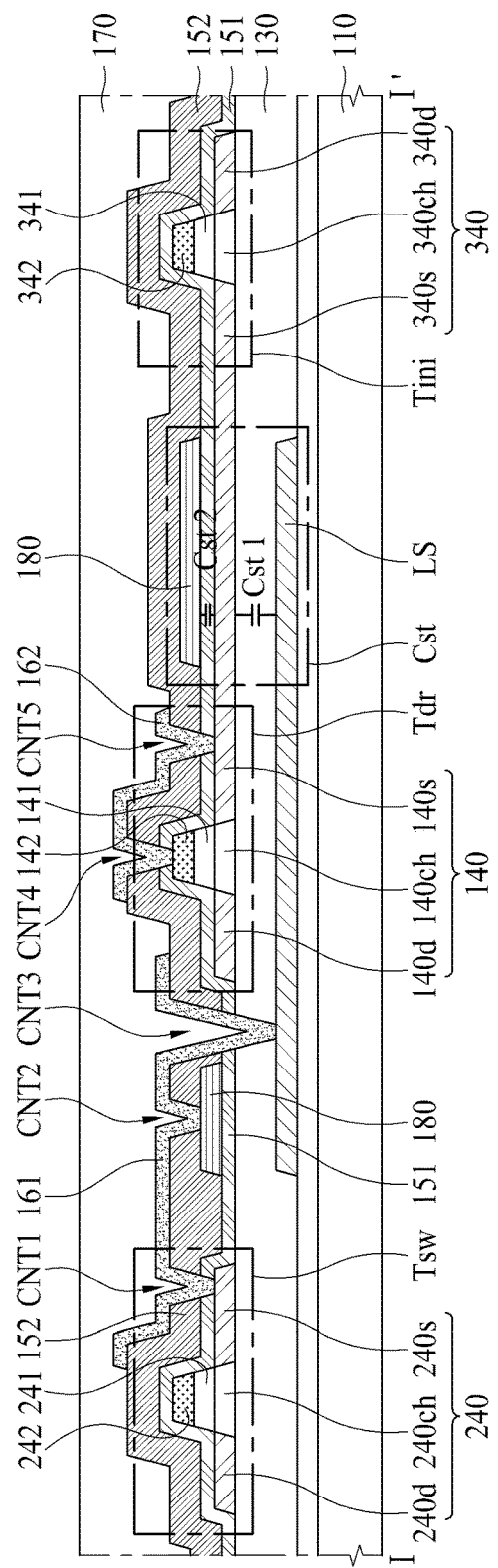
FIG. 4 is a cross sectional view along I-I' of FIG. 3.

FIG. 3 is a plan view illustrating a thin film transistor substrate according to one embodiment of the present disclosure. FIG. 4 is a cross sectional view along I-I' of FIG. 3.

The thin film transistor substrate according to one embodiment of the present disclosure may include a lower substrate 110, a light shielding layer (LS), a buffer layer 130, a driving transistor (Tdr), a switching transistor (Tsw), an initialization transistor (Tini), first and second insulating interlayers 151 and 152, first and second source/drain contact patterns 161 and 162, a protection layer 170, a storage capacitor (Cst), and an upper capacitor electrode 180.

The lower substrate 110 supports elements for forming the driving transistor (Tdr), the storage capacitor (Cst), and the initialization transistor (Tini) provided thereon.

The light shielding layer (LS) is disposed on the lower substrate 110. The light shielding layer (LS) is continuously disposed on an entire area for the driving transistor (Tdr), and an entire area for the first storage capacitor (Cst1). The area for the driving transistor (Tdr) corresponds to a right area with respect to a central area, and the area for the first storage capacitor (Cst1) corresponds to a left area with respect to the central area. The light shielding layer (LS) is disposed onto a boundary line of an area for the initialization transistor (Tini). The light shielding layer (LS) may be formed of a metal material with good electrical conduction.

The light shielding layer (LS) receives the first voltage through the first source/drain contact pattern 161. The light shielding layer (LS) is connected with the first source/drain contact pattern 161 via a third contact hole (CNT3). The first source/drain contact pattern 161 is connected with a source electrode of the switching transistor (Tsw) via a first contact hole (CNT1). The source electrode of the switching transistor (Tsw) is supplied with the first voltage. The light shielding layer (LS) may receive the first voltage supplied from the source electrode of the switching transistor (Tsw). Accordingly, the light shielding layer (LS) serves as a bottom gate of the driving transistor (Tdr). Additionally, the light shielding layer (LS) is used as a lower capacitor electrode of the storage capacitor (Cst).

The buffer layer 130 is disposed on the light shielding layer (LS) and the lower substrate 110. The buffer layer 130 is continuously disposed below areas for the driving transistor (Tdr), the switching transistor (Tsw), the storage capacitor (Cst), and the initialization transistor (Tini). The buffer layer 130 may be formed of an insulating material such as silicon oxide or silicon nitride, but is not limited to these materials. For example, the buffer layer 130 may be formed of an insulating material such as photo acryl or benzocyclobutene (BCB).

The driving transistor (Tdr) is disposed on the buffer layer 130. The driving transistor (Tdr) includes a driving transistor active layer 140, a driving transistor gate insulating film 141, and a driving transistor upper electrode 142.

The driving transistor active layer 140 is disposed on the buffer layer 130. The driving transistor active layer 140 may be formed of an oxide such as zinc oxide, tin oxide, Ga—In—Zn oxide, In—Zn oxide, or In—Sn oxide, or may be formed of an oxide doped with a material of Al, Ni, Cu, Ta, Mo, Zr, V, Hf, or Ti. The driving transistor active layer 140 may include a driving transistor channel layer 140*ch*, a driving transistor drain layer 140*d*, and a driving transistor source layer 140*s*. The driving transistor drain layer 140*d* and the driving transistor source layer 140*s* are disposed to be parallel to each other under the condition that the driving transistor channel layer 140*ch* is interposed between the driving transistor drain layer 140d and the driving transistor source layer 140s. In this case, each of the driving transistor drain layer 140d and the driving transistor source layer 140s becomes a conductor by an electrical-conducting process.

The driving transistor channel layer 140ch is formed below an area for the driving transistor upper electrode 142. The driving transistor gate insulating film 141 is disposed on the driving transistor channel layer 140ch. The driving transistor gate insulating film 141 is formed of a material with good electric insulation. The driving transistor upper electrode 142 is disposed on the driving transistor gate insulating film 141.

In one embodiment, the driving transistor upper electrode 142 is connected with the second source/drain contact pattern 162 via a fourth contact hole (CNT4). The second source/drain contact pattern 162 is connected with the driving transistor source layer 140s via a fifth contact hole (CNT5). Accordingly, the second source/drain contact pattern 162 is connected with the driving transistor source layer 140s, whereby the driving transistor upper electrode 142 is capable of receiving the source voltage.

For the embodiment of the present disclosure in which the upper electrode 142 is connected to the source 140s, the driving transistor upper electrode 142 is not used as a gate electrode; therefore a transistor drive signal is not applied to the driving transistor upper electrode 142. However, if the driving transistor upper electrode 142 is in a floating state, it may cause a problem related with the driving of the driving transistor (Tdr). In order to prevent the driving transistor upper electrode 142 from being in the floating state, as shown in FIG. 4, the driving transistor upper electrode 142 may be connected with the driving transistor source layer 140s, but is not limited to this structure. For example, the fourth contact hole (CNT4) connected with the driving transistor upper electrode 142 may be provided so as to receive the second voltage at N3 from the initialization transistor (Tini). In this case, although not shown, an area for the fourth contact hole (CNT4) is separated from an area for the fifth contact hole (CNT5), and a different conductor pattern is used, so that the source voltage is supplied to the source/drain pattern connected with the fifth contact hole (CNT5), and the second voltage from N3 is supplied to the source/drain pattern from Tini that is connected with the fourth contact hole (CNT4), thus connecting CNT4 with N3, instead of to 140s for this embodiment. Namely, while, in the embodiment shown in FIG. 4, the same source pattern is shown connecting 140s of Tdr to 340s of Tini, in another embodiment, source 140s is provided a separate voltage via CNT5, and it is not connected to 340s.

The driving transistor drain layer 140d is disposed adjacent to the driving transistor channel layer 140ch. The driving transistor drain layer 140d forms a drain electrode of the driving transistor (Tdr).

The driving transistor source layer 140s is disposed adjacent to the driving transistor channel layer 140ch. The driving transistor source layer 140s forms a source electrode of the driving transistor (Tdr). The driving transistor source layer 140s is connected with the second source/drain contact pattern 162 via the fifth contact hole (CNT5). The driving transistor source layer 140s is supplied with the second voltage of N3 from the initialization transistor (Tini) in one embodiment.

Additionally, the driving transistor source layer 140s extends to an area for the storage capacitor (Cst). The driving transistor source layer 140s is used as a common capacitor electrode of the storage capacitor (Cst).

The switching transistor (Tsw) is disposed on the buffer layer 130. The switching transistor (Tsw) includes a switching transistor active layer 240, a switching transistor gate insulating film 241, and a switching transistor gate electrode 242.

The switching transistor active layer 240 is disposed on the buffer layer 130. The switching transistor active layer 240 may be formed of an oxide such as zinc oxide, tin oxide, Ga—In—Zn oxide, In—Zn oxide, or In—Sn oxide, or may be formed of an oxide doped with a material of Al, Ni, Cu, Ta, Mo, Zr, V, Hf, or Ti. The switching transistor active layer 240 includes a switching transistor channel layer 240ch, a switching transistor drain layer 240d, and a switching transistor source layer 240s. The switching transistor drain layer 240d and the switching transistor source layer 240s are disposed to be parallel to each other under the condition that the switching transistor channel layer 240ch is interposed between the switching transistor drain layer 240d and the switching transistor source layer 240s. In this case, each of the switching transistor drain layer 240d and the switching transistor source layer 240s becomes a conductor by an electrical-conducting process.

The switching transistor channel layer 240ch is formed below an area for the switching transistor gate electrode 242. The switching transistor gate insulating film 241 is disposed on the switching transistor channel layer 240ch. The switching transistor gate insulating film 241 is formed of a material with good electric insulation. The switching transistor gate electrode 242 is disposed on the switching transistor gate insulating film 241. The switching transistor gate electrode 242 receives the first scan signal (Scan1).

The switching transistor drain layer 240d is disposed adjacent to the switching transistor channel layer 240ch. The switching transistor drain layer 240d forms a drain electrode of the switching transistor (Tsw). The switching transistor drain layer 240d receives the data voltage (Vdata).

The switching transistor source layer 240s is disposed adjacent to the switching transistor channel layer 240ch. The switching transistor source layer 240s forms a source electrode of the switching transistor (Tsw). The switching transistor source layer 240s has the first voltage. The switching transistor source layer 240s is connected with the first source/drain contact pattern 161 via a first contact hole (CNT1). Accordingly, the switching transistor source layer 240s may supply the first voltage to the first source/drain contact pattern 161.

The initialization transistor (Tini) is disposed on the buffer layer 130. The initialization transistor (Tini) includes an initialization transistor active layer 340, an initialization transistor gate insulating film 341, and an initialization transistor gate electrode 342.

The initialization transistor active layer 340 is disposed on the buffer layer 130. The initialization transistor active layer 340 may be formed of an oxide such as zinc oxide, tin oxide, Ga—In—Zn oxide, In—Zn oxide, or In—Sn oxide, or may be formed of an oxide doped with a material of Al, Ni, Cu, Ta, Mo, Zr, V, Hf, or Ti. The initialization transistor active layer 340 may include an initialization transistor channel layer 340ch, an initialization transistor drain layer 340d, and an initialization transistor source layer 340s. The initialization transistor drain layer 340d and the initialization transistor source layer 340s are disposed to be parallel to each other under the condition that the initialization transistor channel layer 340ch is interposed between the initialization transistor drain layer 340d and the initialization transistor source layer 340s. In this case, each of the initialization transistor drain layer 340d and the initialization transistor source layer 340s becomes a conductor by an electrical-conducting process.

The initialization transistor channel layer 340ch is formed below an area for the initialization transistor gate electrode 342. The initialization transistor gate insulating film 341 is disposed on the initialization transistor channel layer 340ch. The initialization transistor gate insulating film 341 is formed of a material with good electric insulation. The initialization transistor gate electrode 342 is disposed on the initialization transistor gate insulating film 341. The initialization transistor gate electrode 342 receives the second scan signal (Scan2).

The initialization transistor drain layer 340d is disposed adjacent to the initialization transistor channel layer 340ch. The initialization transistor drain layer 340d forms a drain electrode of the initialization transistor (Tini). The initialization transistor drain layer 340d receives the initialization voltage (Vini).

The initialization transistor source layer 340s is disposed adjacent to the initialization transistor channel layer 340ch. The initialization transistor source layer 340s forms a source electrode of the initialization transistor (Tini). The initialization transistor source layer 340s has the second voltage.

The initialization transistor source layer 340s is connected with the driving transistor source layer 140s in one embodiment. For this, the driving transistor source layer 140s and the initialization transistor source layer 340s are arranged as a single continuous layer. Accordingly, the initialization transistor source layer 340s may supply the first voltage to the driving transistor source layer 140s.

Additionally, the initialization transistor source layer 140s extends to an area for the storage capacitor (Cst), whereby the initialization transistor source layer 140s is used as a common capacitor electrode of the storage capacitor (Cst).

The first insulating interlayer 151 is disposed on the buffer layer 130, the driving transistor (Tdr), the switching transistor (Tsw), and the initialization transistor (Tini). The second insulating interlayer 152 is disposed on the first insulating interlayer 151. Insulation layer 152 also overlays capacitor electrode 180. The first and second insulating interlayers 151 and 152 are formed of a material with good electric insulation.

The first source/drain contact pattern 161 is disposed on the second insulating interlayer 152. The first source/drain contact pattern 161 has the first to third contact holes (CNT1~CNT3). The first source/drain contact pattern 161 is connected with the switching transistor source layer 240s via the first contact hole (CNT1). The first source/drain contact pattern 161 is supplied with the first voltage from the switching transistor source layer 240s. The first source/drain contact pattern 161 is connected with the upper capacitor electrode 180 via the second contact hole (CNT2). The first source/drain contact pattern 161 supplies the first voltage to the upper capacitor electrode 180.

The first source/drain contact pattern 161 is connected with the light shielding layer (LS) via the third contact hole (CNT3). The first source/drain contact pattern 161 supplies the first voltage to the light shielding layer (LS). The first source/drain contact pattern 161 may be formed in a single-layered structure of molybdenum (Mo), aluminum (Al), chrome (Cr), aurums (Au), titanium (Ti), nickel (Ni), neodymium (Nd), copper (Cu), or their alloys, or a multi-layered structure including at least two layers of metal materials selected from molybdenum (Mo), aluminum (Al), chrome (Cr), aurums (Au), titanium (Ti), nickel (Ni), neodymium (Nd), copper (Cu), or their alloys.

The second source/drain contact pattern 162 is disposed on the second insulating interlayer 152. The second source/drain contact pattern 162 has the fourth and fifth contact holes (CNT4, CNT5). The second source/drain contact pattern 162 is connected with the driving transistor upper electrode 142 via the fourth contact hole (CNT4). The second source/drain contact pattern 162 supplies the second voltage to the driving transistor upper electrode 142 in one embodiment. The second source/drain contact pattern 162 is connected with the driving transistor source layer 140s via the fifth contact hole (CNT5). The second source/drain contact pattern 162 is supplies with the second voltage from the driving transistor source layer 140s. The second source/drain contact pattern 162 may be formed in a single-layered structure of molybdenum (Mo), aluminum (Al), chrome (Cr), aurums (Au), titanium (Ti), nickel (Ni), neodymium (Nd), copper (Cu), or their alloys, or a multi-layered structure including at least two layers of metal materials selected from molybdenum (Mo), aluminum (Al), chrome (Cr), aurums (Au), titanium (Ti), nickel (Ni), neodymium (Nd), copper (Cu), or their alloys.

The protection layer 170 is disposed on the first and second source/drain contact patterns 161 and 162. The protection layer 170 prevents external moisture, oxygen, or foreign matters from being permeated into the inside of the thin film transistor.

The storage capacitor (Cst) is disposed between the driving transistor (Tdr) and the initialization transistor (Tini). The storage capacitor (Cst) includes the first and second storage capacitors (Cst1, Cst2).

The first storage capacitor (Cst1) is formed by the driving transistor source layer 140s and the light shielding layer (LS) being the two electrodes and the buffer layer 130 being the dielectric of that first capacitor. The second storage capacitor (Cst2) is formed by the driving transistor source layer 140s and the upper capacitor electrode 180 being the two electrodes and the insulation layer 151 being the dielectric of that second capacitor. The driving transistor source layer 140s becomes a common electrode of the first and second storage capacitors (Cst1, Cst2).

The upper capacitor electrode 180 is disposed on the first insulating interlayer 151. The upper capacitor electrode 180 is connected with the first source/drain contact pattern 161 via the second contact hole (CNT2). The upper capacitor electrode 180 is supplied with the first voltage from the first source/drain contact pattern 161. The upper capacitor electrode 180 is formed of a material with good electrical conduction.

The first source/drain contact pattern 161 connects the source electrode of the switching transistor (Tsw) and the light shielding layer (LS) with each other. The first source/drain contact pattern 161 supplies the first voltage to the light shielding layer (LS).

The second source/drain contact pattern 162 connects the driving transistor upper electrode 142 and the source electrode of the driving transistor (Tdr) with each other. In the thin film transistor substrate according to one embodiment of the present disclosure, the source electrode of the driving transistor (Tdr) is connected with the source electrode of the initialization transistor (Tini). Accordingly, the second source/drain contact pattern 162 may be supplied with the second voltage at node N3 from the source electrode of the initialization transistor (Tini).

The first and second source/drain contact patterns 161 and 162 may be formed in a single-layered structure of molybdenum (Mo), aluminum (Al), chrome (Cr), aurums (Au), titanium (Ti), nickel (Ni), neodymium (Nd), copper (Cu), or their alloys, or a multi-layered structure including at least two layers of metal materials selected from molybdenum (Mo), aluminum (Al), chrome (Cr), aurums (Au), titanium (Ti), nickel (Ni), neodymium (Nd), copper (Cu), or their alloys.

Via the second contact hole (CNT2), the upper capacitor electrode 180 and the first source/drain contact pattern 161 are connected with each other. The first source/drain contact pattern 161 connected with the second contact hole (CNT2) is supplied with the first voltage from the source electrode of the switching transistor (Tsw). The second contact hole (CNT2) supplies the first voltage to the upper capacitor electrode 180.

The third contact hole (CNT3) is provided in such a way that the third contact hole (CNT3) is present only at a predetermined location outside the active layer (ACT) in the area for the driving transistor (Tdr) on the light shielding layer (LS). Via the third contact hole (CNT3), the light shielding layer (LS) and the first source/drain contact pattern 161 are connected with each other. The first source/drain contact pattern 161 connected with the third contact hole (CNT3) is supplied with the first voltage from the switching transistor (Tsw). The first voltage is supplied to the light shielding layer (LS) via the third contact hole (CNT3) so that the light shielding layer (LS) may be used as a bottom gate to control the turning on and off operation of transistor Tdr.

Via the fourth contact hole (CNT4), the upper electrode 142 of the driving transistor (Tdr) and the second source/drain contact pattern 162 are connected with each other. The second source/drain contact pattern 162 is supplied with the second voltage. Accordingly, the second source/drain contact pattern 162 may supply the second voltage to the driving transistor upper electrode 142.

Via the fifth contact hole (CNT5), the second source/drain contact pattern 162 and the source electrode of the initialization transistor (Tini) are connected with each other. Accordingly, the second source/drain contact pattern 162 may be supplied with the second voltage from the source electrode of the initialization transistor (Tini) in one embodiment.

It should be noted that individual features of FIG. 4 are not drawn to the same relative scale as those same features in FIG. 3. This permits more clearly showing the connections of the different layers in FIG. 4 in a more compact space according to the inventive disclosure herein. As one example, the relative distance along line I'-I" of in FIG. 3 between different elements, such as contacts CNT1 and CNT2 is different than the relative distance between these same two contacts in FIG. 4. As a second example, in FIG. 4, the contact CNT2 is shown in the center of layer 180, but when viewed along line I'-I" of FIG. 3, it is not in the center of this layer 180 at this location. Thus, FIG. 4 shows the proper connections according to one embodiment, but not all layers and connection locations are to the same relative scale as the same elements in FIG. 3.

The thin film transistor substrate according to one embodiment of the present disclosure includes the light shielding layer (LS), the buffer layer 130 for covering the light shielding layer (LS), and the driving transistor (Tdr) prepared on the buffer layer 130 so as to be overlapped with the light shielding layer (LS) and provided to supply the driving current to the organic light emitting diode (OLED).

The driving transistor (Tdr) according to one embodiment of the present disclosure receives the first voltage through the light shielding layer (LS). In this case, the light shielding layer (LS) of the driving transistor (Tdr) serves as the gate electrode. Also, if the light shielding layer (LS) serves as the gate electrode, the buffer layer 130 serves as the gate insulating film. Accordingly, the driving transistor according to one embodiment of the present disclosure may realize the transistor operation of being turned on by the bottom gate method without an additional electrode layer required.

The driving transistor (Tdr) according to one embodiment of the present disclosure includes the driving transistor active layer 140 having the driving transistor source layer 140*s*, the driving transistor drain layer 140*d*, and the driving transistor channel layer 140*ch*, wherein the driving transistor active layer 140 is overlapped with the light shielding layer (LS), the driving transistor gate insulating film 141 overlapped with the driving transistor channel layer 140*ch*, and the driving transistor upper electrode 142 prepared on the driving transistor gate insulating film 141.

The driving transistor upper electrode 142 according to one embodiment of the present disclosure receives the second voltage which is different from the first voltage. In this case, the voltage received in the driving transistor upper electrode 142 is different from the voltage received in the light shielding layer (LS). Also, the driving transistor upper electrode 142 may serve as the electrode for another function instead of the gate electrode.

The driving transistor upper electrode 142 according to one embodiment of the present disclosure may be electrically connected with the driving transistor source layer 140*s*. The driving transistor upper electrode 142 is connected with the second source/drain contact pattern 162 via the fourth contact hole (CNT4). The driving transistor source layer 140*s* is connected with the second source/drain contact pattern 162 via the fifth contact hole (CNT5). If the driving transistor upper electrode 142 is electrically connected with the driving transistor source layer 140*s*, it is possible to prevent the electrically-floating state of the driving transistor upper electrode 142.

A thickness of the buffer layer 130 according to one embodiment of the present disclosure is larger than a thickness of the driving transistor gate insulating film 141. Owing to the physical properties of the transistor, according as the thickness of the layer which functions as the gate insulating film becomes larger, an inclination of S-factor graph in the transistor is decreased so that it is possible to realize a delicate grayscale expression. Also, the buffer layer 130 is relatively thicker than the driving transistor gate insulating film 141. Accordingly, in case of the driving transistor (Tdr) according to one embodiment of the present disclosure in which the light shield LS acts as the gate electrode, the gate insulating film 130 is relatively thicker so that it is possible to realize a delicate grayscale expression.

According to one embodiment of the present disclosure, there is the switching transistor (Tsw) for supplying the first voltage to the light shielding layer (LS), wherein the switching transistor (Tsw) is prepared on the buffer layer 130. The switching transistor (Tsw) according to the present disclosure enables the light shielding layer (LS) to function as the bottom gate electrode for transistor Tdr.

The switching transistor (Tsw) according to one embodiment of the present disclosure includes the switching transistor active layer 240 having the switching transistor source layer 240*s*, the switching transistor drain layer 240*d*, and the switching transistor channel layer 240*ch* prepared on the buffer layer 130, the switching transistor gate insulating film 241 overlapped with the switching transistor channel layer 240*ch*, and the switching transistor gate electrode 242 prepared on the switching transistor gate insulating film 241.

The switching transistor drain layer 240*d* according to one embodiment of the present disclosure receives the data voltage (Vdata), and the switching transistor source layer 240s supplies the first voltage to the light shielding layer (LS). Accordingly, if the switching transistor source layer 240s is turned-on, the driving transistor (Tdr) enables the light shielding layer (LS) to function as the bottom gate electrode.

According to one embodiment of the present disclosure, there is the initialization transistor (Tini) connected with the driving transistor source layer 140s. The initialization transistor (Tini) supplies the second voltage to the driving transistor source layer 140s. Accordingly, the driving transistor source layer 140s has the second voltage.

According to one embodiment of the present disclosure, there is the light emitting control transistor (Tem) connected with the driving power source (VDD) and the driving transistor drain layer 140d. The light emitting control transistor (Tem) controls the driving of the driving transistor (Tdr) by the use of light emitting control signal (EM). The light emitting control transistor (Tem) controls the driving of the driving transistor (Tdr) by the use of driving power source (VDD) as well as the first voltage supplied from the switching transistor (Tsw). Accordingly, it is possible to control the driving of the driving transistor (Tdr) in various methods.

According to one embodiment of the present disclosure, there is the storage capacitor (Cst) prepared in the overlap area between the light shielding layer (LS) and the driving transistor (Tdr). If the storage capacitor (Cst) is prepared in the overlap area between the light shielding layer (LS) and the driving transistor (Tdr), it is possible to improve the capacity of the storage capacitor (Cst).

According to one embodiment of the present disclosure, there is the upper capacitor electrode 180 overlapped with the driving transistor source layer 140s. The storage capacitor (Cst) according to one embodiment of the present disclosure includes the first storage capacitor (Cst1) prepared between the driving transistor source layer 140s and the light shielding layer (LS), and the second storage capacitor (Cst2) prepared between the driving transistor source layer 140s and the upper capacitor electrode 180.

The first and second storage capacitors (Cst1, Cst2), which are connected with each other in parallel, uses the driving transistor source layer 140s as the common electrode. The capacity of the storage capacitor (Cst) corresponds to the total of the capacity of the first storage capacitor (Cst1) and the capacity of the second storage capacitor (Cst2). Accordingly, if providing the upper capacitor electrode 180, it is possible to improve the capacity of the storage capacitor (Cst).

According to one embodiment of the present disclosure, there is the first insulating interlayer 151 for covering the driving transistor active layer 140 and the driving transistor upper electrode 142. The upper capacitor electrode 180 according to one embodiment of the present disclosure is prepared on the first insulating interlayer 151 overlapped with the driving transistor source layer 140s. Accordingly, if the upper capacitor electrode 180 is prepared on the first insulating interlayer 151, it is possible to improve the capacity of the second storage capacitor (Cst2) formed by the upper capacitor electrode 180.

Figure 5:
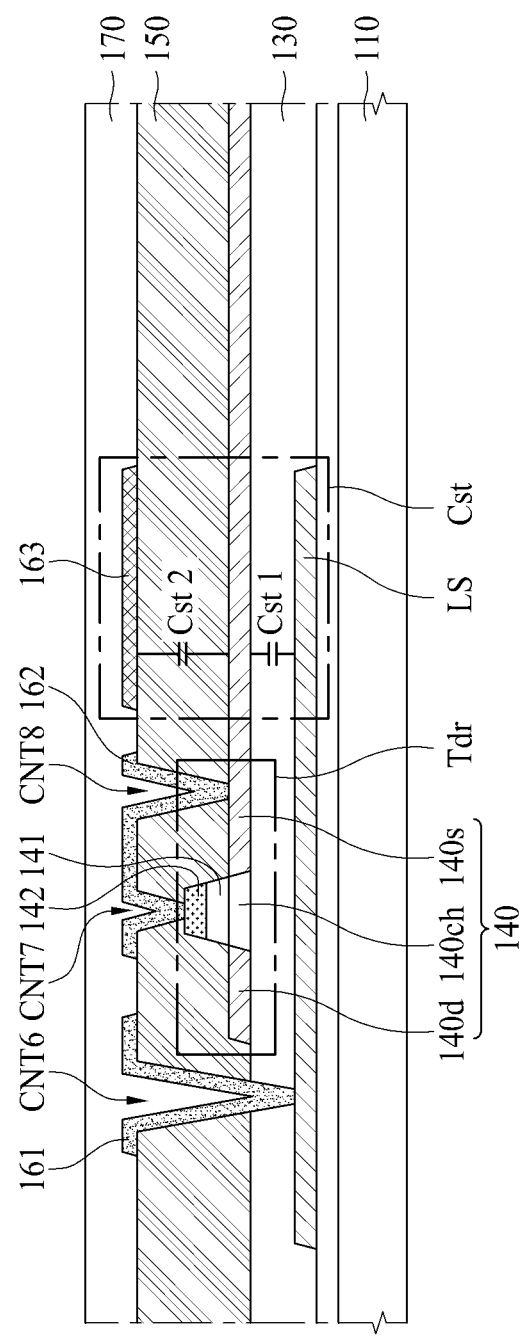
FIG. 5 is a cross sectional view illustrating a thin film transistor substrate according to another embodiment of the present disclosure.

FIG. 5 is a cross sectional view illustrating a thin film transistor substrate according to another embodiment of the present disclosure. The thin film transistor substrate according to another embodiment of the present disclosure includes a lower substrate 110, a light shielding layer (LS), a buffer layer 130, a driving transistor (Tdr), an insulating interlayer 150, a storage capacitor (Cst), first to third source/drain contact patterns 161~163, and a protection layer 170. The lower substrate 110, the light shielding layer (LS), the buffer layer 130, the driving transistor (Tdr), the insulting interlayer 150, and the protection layer 170 in the thin film transistor substrate according to another embodiment of the present disclosure are the same as those of the aforementioned thin film transistor substrate according to one embodiment of the present disclosure; therefore a detailed description for the lower substrate 110, the light shielding layer (LS), the buffer layer 130, the driving transistor (Tdr), the insulting interlayer 150, and the protection layer 170 will be omitted.

The insulating interlayer 150 is formed on the buffer layer 130 and the driving transistor (Tdr). The insulating interlayer 150 is formed of a material with good insulating properties. Specifically, the insulating interlayer 150 may be formed of a material with a high dielectric constant, for example, SiNx or Al2O3. The storage capacitor (Cst) is formed in the insulating interlayer 150. According as a dielectric constant of a material provided between two electrodes of the capacitor becomes larger, the capacity of the capacitor is improved. Thus, if the insulating interlayer 150 is formed of the material with the high dielectric constant, it is possible to improve the capacity of the storage capacitor (Cst).

The storage capacitor (Cst) includes a first storage capacitor (Cst1) and a second storage capacitor (Cst2). The first and second storage capacitors (Cst1, Cst2) use a driving transistor source layer 140s as a common capacitor electrode. The first storage capacitor (Cst1) uses the light shielding layer (LS) as a lower capacitor electrode, and the second storage capacitor (Cst2) uses the third source/drain contact pattern 163 as an upper capacitor electrode.

The first to third source/drain contact patterns 161~163 are provided on the insulating interlayer 150. The first source/drain contact pattern 161 is connected with the light shielding layer (LS) via a sixth contact hole (CNT6). The first source/drain contact pattern 161 supplies a first voltage to the light shielding layer (LS). The second source/drain contact pattern 162 is connected with a driving transistor upper electrode 142 via a seventh contact hole (CNT7). The second source/drain contact pattern 162 supplies a second voltage to the driving transistor upper electrode 142. The second source/drain contact pattern 162 is connected with the driving transistor source layer 140s via an eighth contact hole (CNT8). The second source/drain contact pattern 162 receives the second voltage from the driving transistor source layer 140s. The third source/drain contact pattern 163 is disposed in an area for the storage capacitor (Cst), whereby the third source/drain contact pattern 163 serves as an upper capacitor electrode. The first to third source/drain contact patterns 161~163 may be formed in a single-layered structure of molybdenum (Mo), aluminum (Al), chrome (Cr), aurums (Au), titanium (Ti), nickel (Ni), neodymium (Nd), copper (Cu), or their alloys, or a multi-layered structure including at least two layers of metal materials selected from molybdenum (Mo), aluminum (Al), chrome (Cr), aurums (Au), titanium (Ti), nickel (Ni), neodymium (Nd), copper (Cu), or their alloys.

Although not shown in the cross sectional view, the first source/drain contact pattern 161 according to another embodiment of the present disclosure is connected with the third source/drain contact pattern 163. The third source/drain contact pattern 163 may receive the first voltage. Accordingly, in case of the thin film transistor substrate according to another embodiment of the present disclosure, an area of the third source/drain contact pattern 163 is increased in its size.

The thin film transistor substrate according to another embodiment of the present disclosure includes the first source/drain contact pattern 161 connected with the light shielding layer (LS), the second source/drain contact pattern 162 for electrically connecting the driving transistor upper electrode 142 and the driving transistor source layer 140s with each other, and the third source/drain contact pattern 163 electrically connected with the first source/drain contact pattern 161 and prepared at the same layer as the second source/drain contact pattern 162 so as to form the storage capacitor (Cst). In this case, the first to third source/drain contact patterns 161~163 are manufactured at the same time by the same manufacturing process using the same mask. Accordingly, it is possible to form the third source/drain contact pattern 163 serving as the upper capacitor electrode without an additional process.

Figure 6:
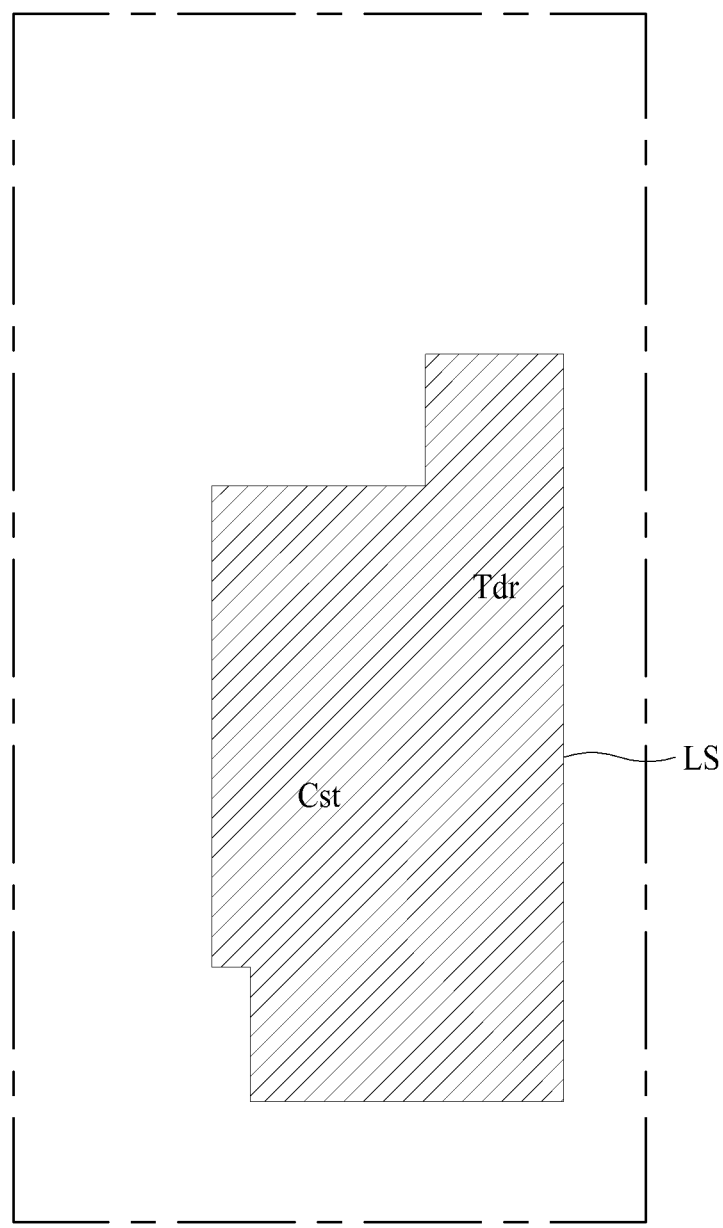
FIG. 6 is a plan view illustrating a light shielding layer of the thin film transistor substrate according to one embodiment of the present disclosure.

FIG. 6 is a plan view illustrating the light shielding layer (LS) of the thin film transistor substrate according to one embodiment of the present disclosure.

The light shielding layer (LS) is disposed on the lower substrate. The light shielding layer (LS) is continuously disposed on the entire area for the driving transistor (Tdr), and the entire area for the first storage capacitor (Cst1). The area for the driving transistor (Tdr) corresponds to the right area with respect to the central area, and the area for the first storage capacitor (Cst1) corresponds to the left area with respect to the central area. The light shielding layer (LS) is disposed onto the boundary line of the area for the initialization transistor (Tini).

Figure 7:
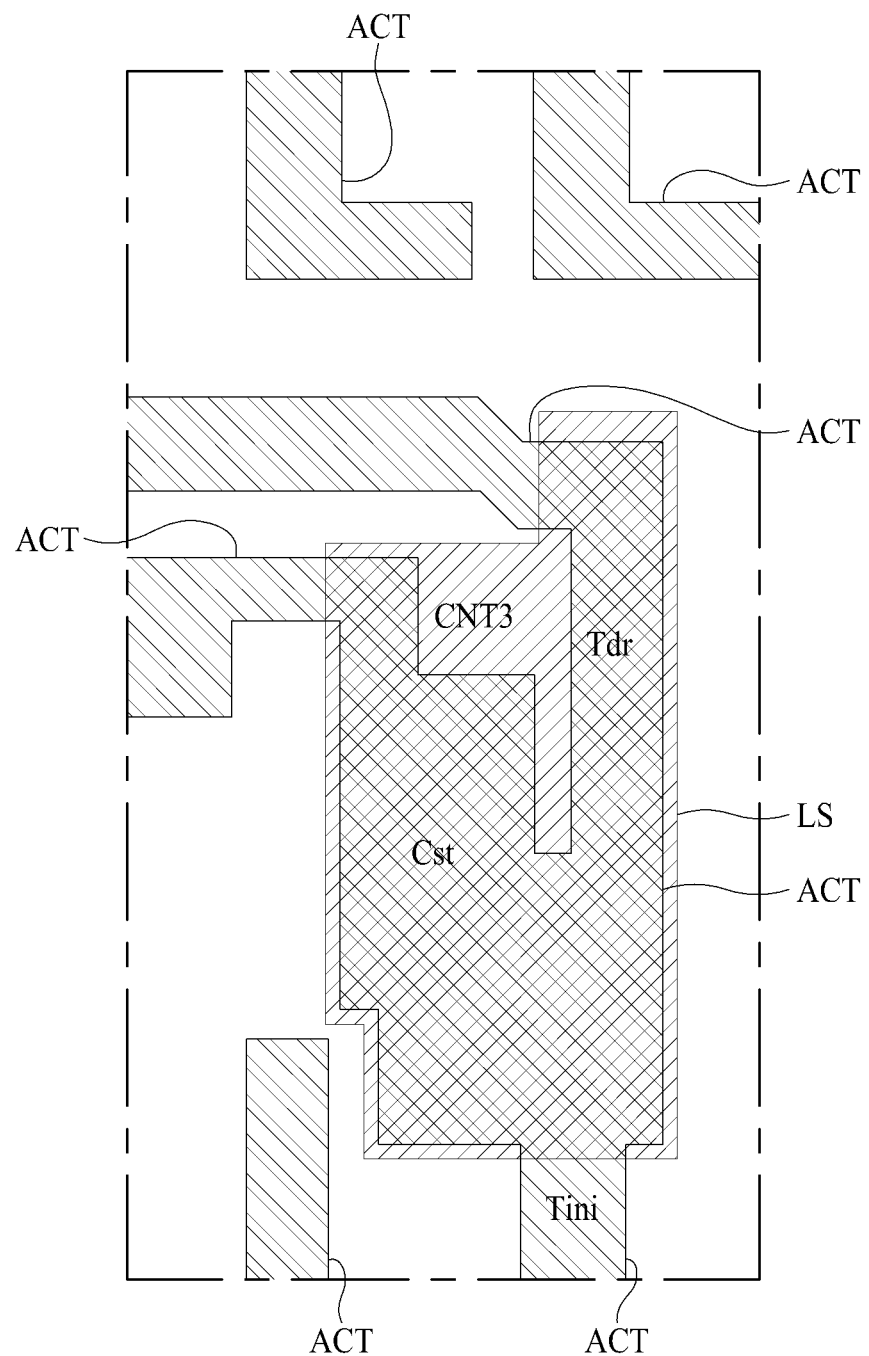
FIG. 7 is a plan view illustrating a light shielding layer and an active layer in the thin film transistor substrate according to one embodiment of the present disclosure.

FIG. 7 is a plan view illustrating the light shielding layer (LS) and the active layer (ACT) of the thin film transistor substrate according to one embodiment of the present disclosure.

The active layer (ACT) is disposed on the area of the light shielding layer (LS) except the third contact hole (CNT3). According as the first voltage is supplied to the light shielding layer (LS) via the third contact hole (CNT3), the light shielding layer (LS) serves as the bottom gate electrode.

Also, the active layer (ACT) extends to the area for the light emitting control transistor (Tem), and the area for the second storage capacitor (Cst2). The area for the light emitting control transistor (Tem) corresponds to an upper left area, and the area for the second storage capacitor (Cst2) corresponds to a central left area.

The active layer (ACT) extends to the area for the initialization transistor (Tini). The area for the initialization transistor (Tini) corresponds to a central left area. The area for the initialization transistor (Tini) corresponds to a lower right area, and an upper right area. The active layer (ACT) of the area for the initialization transistor (Tini) formed in the lower right area is continuously connected with the active layer (ACT) of the area for the initialization transistor (Tini) formed in the upper right area.

The active layer (ACT) is additionally formed in the area for the switching transistor (Tsw). The area for the switching transistor (Tsw) corresponds to an upper left area, and a lower left area. The active layer (ACT) of the area for the switching transistor (Tsw) formed in the upper left area is continuously connected with the active layer (ACT) of the area for the switching transistor (Tsw) formed in the lower left area.

The active layer (ACT) may be formed of an oxide such as zinc oxide, tin oxide, Ga—In—Zn oxide, In—Zn oxide, or In—Sn oxide, or may be formed of an oxide doped with ions of a material of Al, Ni, Cu, Ta, Mo, Zr, V, Hf, or Ti.

Figure 8:
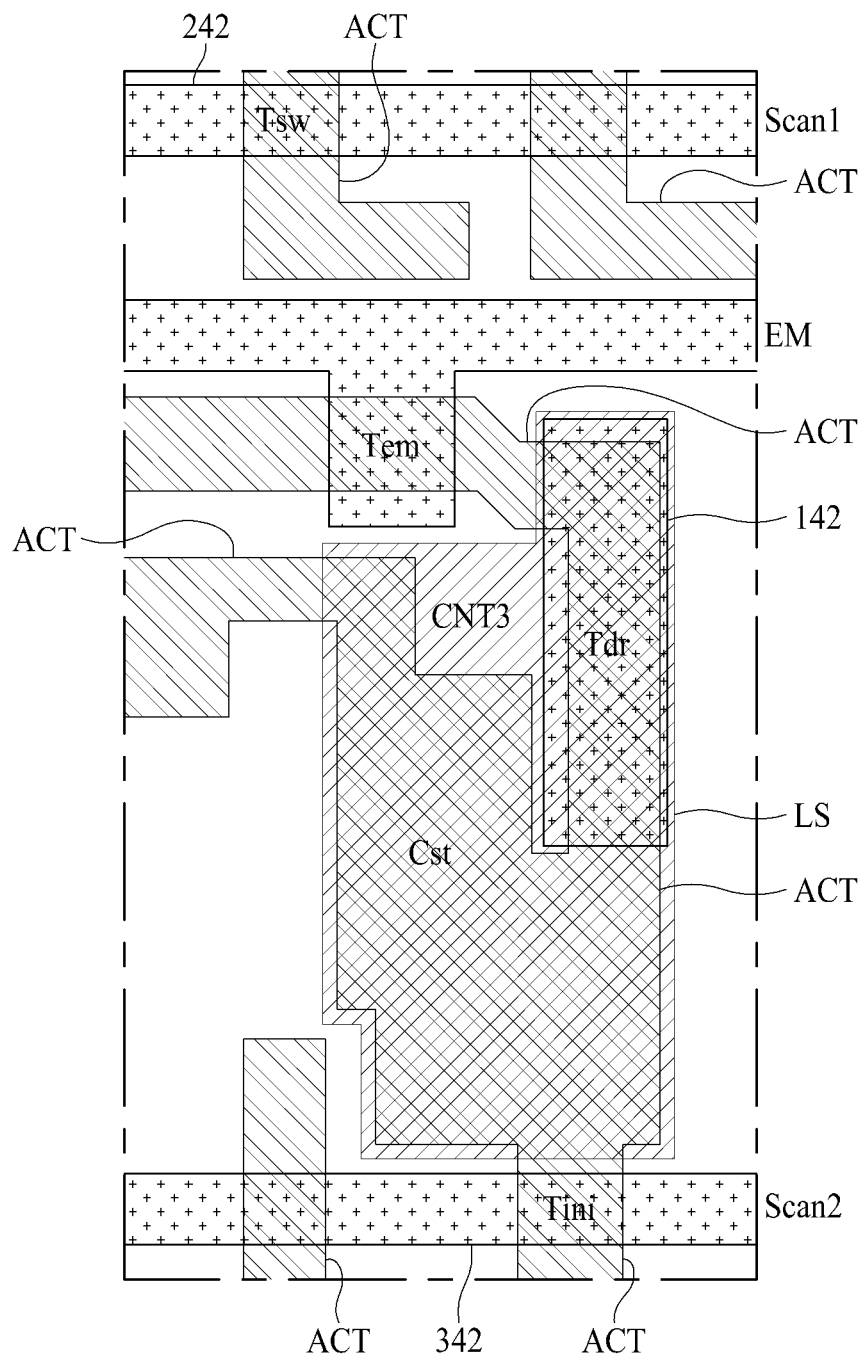
FIG. 8 is a plan view illustrating a light shielding layer, an active layer, a driving transistor upper electrode, a switching transistor gate electrode, and an initialization transistor gate electrode in the thin film transistor substrate according to one embodiment of the present disclosure.

FIG. 8 is a plan view illustrating the light shielding layer (LS), the active layer (ACT), the driving transistor upper electrode 142, the switching transistor gate electrode 242, and the initialization transistor gate electrode 342 in the thin film transistor substrate according to one embodiment of the present disclosure.

The driving transistor upper electrode 142 is formed at the portion for the driving transistor (Tdr) in the overlap area between the light shielding layer (LS) and the active layer (ACT). The switching transistor gate electrode 242 is formed in the upper area, and the initialization transistor gate electrode 342 is formed in the lower area. Unlike the other transistors, the driving transistor upper electrode 142 does not function as the gate electrode. The driving transistor (Tdr) uses the light shielding layer (LS) as the gate electrode.

Figure 9:
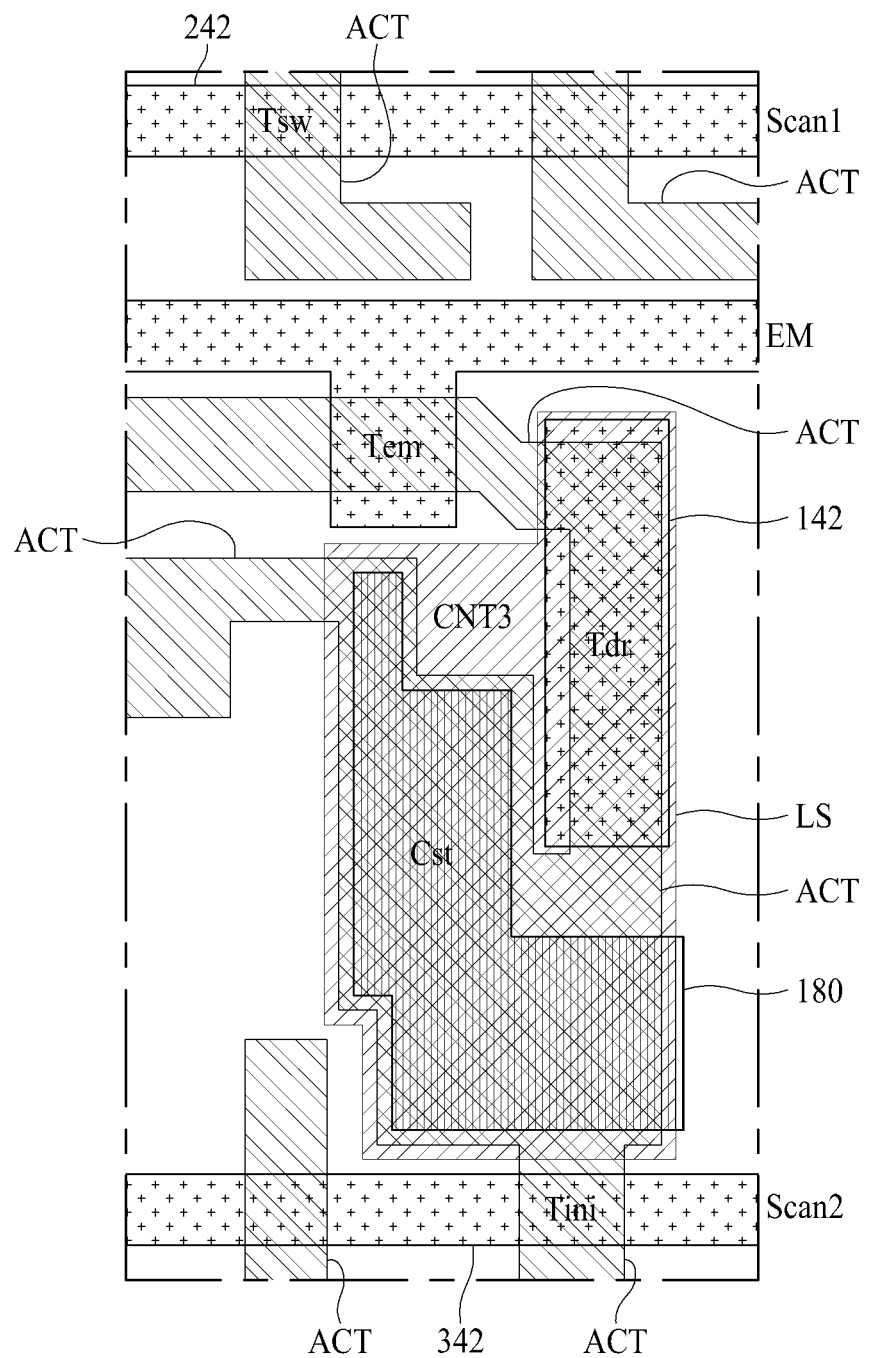
FIG. 9 is a plan view illustrating a light shielding layer, an active layer, a driving transistor upper electrode, a switching transistor gate electrode, an initialization transistor gate electrode, and an upper capacitor electrode in the thin film transistor substrate according to one embodiment of the present disclosure.

FIG. 9 is a plan view illustrating the light shielding layer (LS), the active layer (ACT), the driving transistor upper electrode 142, the switching transistor gate electrode 242, the initialization transistor gate electrode 342, and the upper capacitor electrode 180.

The upper capacitor electrode 180 is disposed at the area for the storage capacitor (Cst) in the area with the active layer (ACT). The upper capacitor electrode 180 is formed of a metal material with good electrical conduction. The upper capacitor electrode 180 may be a metal bar or electrode for forming the capacitor electrode on the area corresponding to the active layer (ACT).

FIG. 10 illustrates a S-factor graph (a) of the related art thin film transistor substrate and a S-factor graph (b) of the thin film transistor substrate according to one embodiment of the present disclosure.

In case of the related art driving transistor, it has a first S-factor (S1) of FIG. 10(*a*) corresponding to a low S-factor in the upper gate structure. Herein, the S-factor indicates a ratio of a change of a gate voltage in the driving transistor to a change of a driving current. In case of the low S-factor, a graph of showing the S-factor has a sharp inclination. If the driving transistor has the first S-factor (S1), a usable range of a data voltage becomes small, whereby it is disadvantageous in low grayscale expression. Also, if the driving transistor has the first S-factor (S1), it may cause a large error of the driving current.

In case of the driving transistor according to one embodiment of the present disclosure, it has a second S-factor (S2) corresponding to a high S-factor in the upper gate structure. If it has the high S-factor, a graph 10(*b*) of showing the S-factor has a more gentle inclination. If the driving transistor has the second S-factor (S2), a usable range of a data voltage becomes large, whereby it is advantageous in low grayscale expression. Also, if the driving transistor has the second S-factor (S2), an error of the driving current is small, as shown in FIG. 10(*b*).

According to one embodiment of the present disclosure, in case of the thin film transistor with the top gate structure which uses the light shielding layer (LS) as the bottom gate device, or if the top gate device is in contact with the bottom gate by the use of source/drain pattern, it is possible to ensure a low current change rate.

The thin film transistor according to one embodiment of the present disclosure has the sufficient thickness by using the buffer layer 130 as the gate insulating film so that it is possible to improve the capacity of the storage capacitor (Cst) needed for the driving of the driving transistor. Accordingly, it is possible to improve the S-factor properties corresponding to the properties between the driving current (Id) and the gate-source voltage (Vgs) of the driving transistor (Tdr).

In more detail, this effect can be obtained when the first source/drain contact pattern 161, which corresponds to a metal electrode of a back channel portion which is a channel generated at an opposite side of the storage capacitor (Cst) in the area for the driving transistor (Tdr), is in contact with the light shielding layer (LS), and is then grounded. Briefly, the top gate device is in contact with the bottom gate, and is then grounded, or the bottom gate device is in contact with the top gate, and is then grounded. In this case, it is possible to maintain a uniform and constant voltage potential of the back channel portion, to thereby realize the good S-factor properties.

In the thin film transistor substrate according to one embodiment of the present disclosure, it is possible to realize the bottom gate device by using the light shielding layer (LS) as the gate electrode.

In the thin film transistor substrate according to one embodiment of the present disclosure, the light shielding layer (LS) of the driving transistor (Tdr) is overlapped with the conductive active layer (ACT) so that it is possible to increase the area used as the storage capacitor (Cst). As is known from the capacitor equation, $$C = k\frac{A}{d},$$

the larger the area A of the capacitor, the larger the capacitor. The capacitance can thus be increased by having a larger dielectric constant k, a larger area A, or a smaller distance d between electrodes of the capacitor. The use of light shielding layer LS and the common source region of transistors Tdr and Tini provides a very large area for the capacitor as compared to prior designs for OLED driving circuits.

In the display device using the thin film transistor substrate according to one embodiment of the present disclosure, it is possible to realize a delicate grayscale expression by decreasing the inclination of the S-factor graph of the driving transistor (Tdr).

According to the present disclosure, the driving transistor having the bottom gate structure in the thin film transistor substrate can be realized by the use of light shielding layer which receives the first voltage.

According to the present disclosure, it is possible to increase the area used as the storage capacitor in the thin film transistor substrate by the use of driving transistor source layer which receives the second voltage.

According to the present disclosure, the thin film transistor has the sufficient thickness by using the buffer layer as the gate insulating film so that it is possible to improve the capacity of the storage capacitor needed for the driving of the driving transistor. Accordingly, it is possible to improve the S-factor properties corresponding to the properties between the driving current and the gate-source voltage of the driving transistor.

According to the present disclosure, the thickness of the buffer layer of the thin film transistor substrate is larger than the thickness of the driving transistor gate insulating film. Accordingly, in case of the display device including the thin film transistor according to one embodiment of the present disclosure, the driving transistor is realized in the bottom gate structure which uses the buffer layer as the gate insulating film so that it is possible to realize a delicate grayscale expression by decreasing the inclination of the S-factor graph of the driving transistor.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A thin film transistor assembly, comprising:
a light shielding layer;
a buffer layer covering the light shielding layer; and
a driving transistor positioned on the buffer layer while being overlapped with the light shielding layer, and connected to supply a driving current to an organic light emitting device,
wherein the driving transistor includes:
a driving transistor active layer having a driving transistor source layer, a driving transistor drain layer, and a driving transistor channel layer, wherein the driving transistor active layer is overlapped with the light shielding layer;
a first driving transistor gate insulating film that overlays the driving transistor channel layer;
a driving transistor lower gate electrode positioned under the driving transistor channel layer; and
a driving transistor upper electrode positioned on the first driving transistor gate insulating film,
wherein the driving transistor lower gate electrode is the light shielding layer that receives a first voltage, and the driving transistor upper electrode receives a second voltage which is different from the first voltage.

2. The thin film transistor assembly according to claim 1, wherein the driving transistor upper electrode is electrically connected with the driving transistor source layer.

3. The thin film transistor assembly according to claim 1, wherein a thickness of the buffer layer is larger than a thickness of the first driving transistor gate insulating film.

4. The thin film transistor assembly according to claim 1, further comprising a switching transistor positioned on the buffer layer and connected to supply the first voltage to the light shielding layer.

5. The thin film transistor assembly according to claim 4, wherein the switching transistor includes:

a switching transistor active layer having a switching transistor source layer, a switching transistor drain layer, and a switching transistor channel layer positioned on the buffer layer;
a switching transistor gate insulating film overlapped with the switching transistor channel layer; and
a switching transistor gate electrode prepared on the switching transistor gate insulating film,
wherein the switching transistor drain layer receives a data voltage, and
the switching transistor source layer supplies the first voltage to the light shielding layer.

6. The thin film transistor assembly according to claim 5, further comprising an initialization transistor connected with the driving transistor source layer.

7. The thin film transistor assembly according to claim 6, further comprising a light emitting control transistor connected with a driving power voltage source and the driving transistor drain layer, wherein the driving transistor source layer and a source layer of the initialization transistor are disposed continuously as a single layer.

8. The thin film transistor assembly according to claim 1, wherein the buffer layer positioned between the driving transistor lower gate electrode and the driving channel layer, the buffer layer acting as a second gate insulating film for the driving transistor.

9. The thin film transistor assembly according to claim 1, further comprising a storage capacitor positioned in an overlap area between the light shielding layer and the driving transistor.

10. The thin film transistor assembly according to claim 9, wherein the storage capacitor is continuously disposed between the driving transistor source layer and the source layer of the initialization transistor.

11. The thin film transistor assembly according to claim 9, further comprising an upper capacitor electrode overlapped with the driving transistor source layer,
wherein the storage capacitor includes:
a first storage capacitor having the driving transistor source layer and the light shielding layer as electrodes, respectively; and
a second storage capacitor having the driving transistor source layer and the upper capacitor electrode as electrodes, respectively.

12. The thin film transistor assembly according to claim 11, further comprising a first insulating interlayer for covering a portion of the driving transistor active layer and the driving transistor upper electrode,
wherein the upper capacitor electrode is positioned on the first insulating interlayer and is overlapped with the driving transistor source layer.

13. The thin film transistor assembly according to claim 9, further comprising:
a first source/drain contact pattern connected with the light shielding layer;
a second source/drain contact pattern electrically connecting the driving transistor upper electrode and the driving transistor source layer with each other; and
a third source/drain contact pattern electrically connected with the first source/drain contact pattern, and positioned to be directly on a same layer as the second source/drain contact pattern so as to form the storage capacitor.

14. A display device, comprising:
a thin film transistor substrate;
a light shielding layer positioned on the thin film transistor substrate;
a buffer layer covering the light shielding layer; and
a driving transistor positioned on the buffer layer while being overlapped with the light shielding layer, and connected to supply a driving current to an organic light emitting device,
wherein the driving transistor includes:
a driving transistor active layer having a driving transistor source layer, a driving transistor drain layer, and a driving transistor channel layer, wherein the driving transistor active layer is overlapped with the light shielding layer;
a driving transistor gate insulating film that overlays the driving transistor channel layer;
a driving transistor lower gate electrode positioned under the driving transistor channel layer; and
a driving transistor upper electrode positioned on the driving transistor gate insulating film,
wherein the driving transistor lower gate electrode is the light shielding layer that receives a first voltage, and the driving transistor upper electrode receives a second voltage which is different from the first voltage; and
a source drive IC attached to a pad portion of the thin film transistor substrate, wherein the source drive IC receives digital video data and a data control signal, converts the digital video data into an analog data voltage in accordance with the data control signal, and supplies the analog data voltage to data lines.

15. The display device according to claim 14, further comprising an upper capacitor electrode overlapped with a driving transistor source layer,
wherein a storage capacitor includes:
a first storage capacitor having the driving transistor source layer and a light shielding layer as electrodes, respectively; and
a second storage capacitor having the driving transistor source layer and the upper capacitor electrode as electrodes, respectively.

16. The display device according to claim 15, further comprising a first insulating interlayer for covering a driving transistor active layer and a driving transistor upper electrode,
wherein the upper capacitor electrode is prepared on the first insulating interlayer overlapped with the driving transistor source layer.

17. A thin film transistor substrate comprising:
a substrate;
a light shielding layer overlying the substrate, the light shielding layer including a metal and being both a first electrode of a first capacitor and a gate electrode of a driving transistor;
an electrically insulating buffer layer covering the light shielding layer; and
the driving transistor prepared on the buffer layer on overlying the light shielding layer, wherein the driving transistor includes:
a driving transistor active layer having a driving transistor source layer and driving transistor channel region that overlay the light shielding layer, the driving transistor source layer connected to be a second electrode of the first capacitor;
a first insulation layer overlying the driving transistor source layer;
a first capacitor electrode of a second capacitor on the first insulation layer and positioned to overlay the driving transistor source electrode to create the second capacitor having the driving transistor source electrode as a second capacitor electrode of the second capacitor and the first insulation layer as the dielectric of the second capacitor.

18. The thin film transistor substrate of claim 17 further comprising:
an electrical connection between the first electrode of the first capacitor transistor and the first electrode of the second capacitor.

19. The thin film transistor substrate of claim 17 further comprising:
a switching transistor having a source region that is electrically connected to the light shielding layer and a drain region that is electrically connected to a data line that will provide a signal on the data line to the light shielding layer when the switching transistor is enabled.

20. The thin film transistor substrate of claim 17 further comprising:
an initialization transistor having a source region that is physically and electrically continuous with the source region of the driving transistor.

* * * * *